United States Patent
Kim et al.

(10) Patent No.: US 8,293,651 B2
(45) Date of Patent: Oct. 23, 2012

(54) METHOD OF FORMING THIN FILM PATTERN FOR SEMICONDUCTOR DEVICE AND APPARATUS FOR THE SAME

(75) Inventors: Hui-Tae Kim, Gyeongsangnam-do (KR); Bong-Soo Kwon, Gyeongsangbuk-do (KR); Hack-Joo Lee, Gyeonggi-do (KR); Nae-Eung Lee, Gyeonggi-do (KR); Jong-Won Shon, Gyunggi-do (KR)

(73) Assignee: Jusung Engineering Co., Ltd., Gwangju-si, Gyeonggi-do ( * ) Notice: Subject to any disclaimer, the term of this patent is extended or adjusted under 35 U.S.C. 154(b) by 860 days.

(21) Appl. No.: 12/259,298

(22) Filed: Oct. 28, 2008

(65) Prior Publication Data
US 2009/0286403 A1    Nov. 19, 2009

(30) Foreign Application Priority Data
May 15, 2008   (KR) .................. 10-2008-0045193

(51) Int. Cl.
*H01L 21/302* (2006.01)
(52) U.S. Cl. ........ 438/703; 438/622; 438/623; 438/637; 438/639; 438/700; 257/E21.029
(58) Field of Classification Search .................. None
See application file for complete search history.

(56) References Cited

U.S. PATENT DOCUMENTS

| | | | |
|---|---|---|---|
| 5,981,398 A * | 11/1999 | Tsai et al. ................. | 438/710 |
| 6,812,131 B1 * | 11/2004 | Kennedy et al. ............ | 438/623 |
| 7,084,071 B1 * | 8/2006 | Dakshina-Murthy et al. .......................... | 438/717 |
| 2004/0023502 A1 * | 2/2004 | Tzou et al. ................. | 438/706 |
| 2004/0082173 A1 * | 4/2004 | Watatani .................... | 438/689 |

* cited by examiner

*Primary Examiner* — Kyoung Lee
(74) *Attorney, Agent, or Firm* — Renaissance IP Law Group LLP (57) ABSTRACT

A method of forming a thin film pattern includes: forming a thin film on a substrate; forming an amorphous carbon layer including first and second carbon layers on the thin film, wherein the first carbon layer is formed by one of a spin-on method and a plasma enhanced chemical vapor deposition (PECVD) method and the second carbon layer is formed by a physical vapor deposition (PVD) method; forming a hard mask layer on the amorphous carbon layer; forming a PR pattern on the hard mask layer; forming a hard mask pattern by etching the hard mask layer using the PR pattern as an etch mask; forming an amorphous carbon pattern including first and second carbon patterns by etching the amorphous carbon layer using the hard mask pattern as an etch mask; and forming a thin film pattern by etching the thin film using the amorphous carbon pattern.

14 Claims, 8 Drawing Sheets

METHOD OF FORMING THIN FILM PATTERN FOR SEMICONDUCTOR DEVICE AND APPARATUS FOR THE SAME

This application claims the benefit of Korean Patent Application No. 10-2008-0045193, filed on May 15, 2008, which is hereby incorporated by a reference in its entirety.

TECHNICAL FIELD

The present invention relates to a method of forming a thin film pattern, and more particularly, to a method of forming a minute thin film pattern for a semiconductor device and an apparatus for the method.

BACKGROUND

In general, a fabrication process for a semiconductor device such as a flat panel display device and a solar cell includes repetition of a deposition step of a thin film, a photolithographic step for a photoresist (PR) pattern and an etch step of the thin film for a thin film pattern. The photolithographic step includes steps of forming a PR layer, exposing the PR layer and developing the exposed PR layer to form the PR pattern. PR materials for g-line of a wavelength of 436 nm, i-line of a wavelength of 365 nm or krypton fluoride (KrF) of a wavelength of 248 nm have been used for the PR layer, and the PR pattern is formed by pattering the PR layer using a photo mask. In addition, the thin film pattern is formed by patterning the thin film using the PR pattern as an etch mask.

Recently, a method of forming a minute thin film pattern has been required for a highly integrated semiconductor device. However, a critical dimension of a thin film pattern formed by a PR pattern is restricted to about 60 nm because of limitation of the photolithographic step. Accordingly, a method of forming a minute thin film pattern having a critical dimension smaller than about 50 nm using amorphous carbon (a-C) and silicon oxynitride (SiON) as an etch mask has been suggested.

Figure 1A:
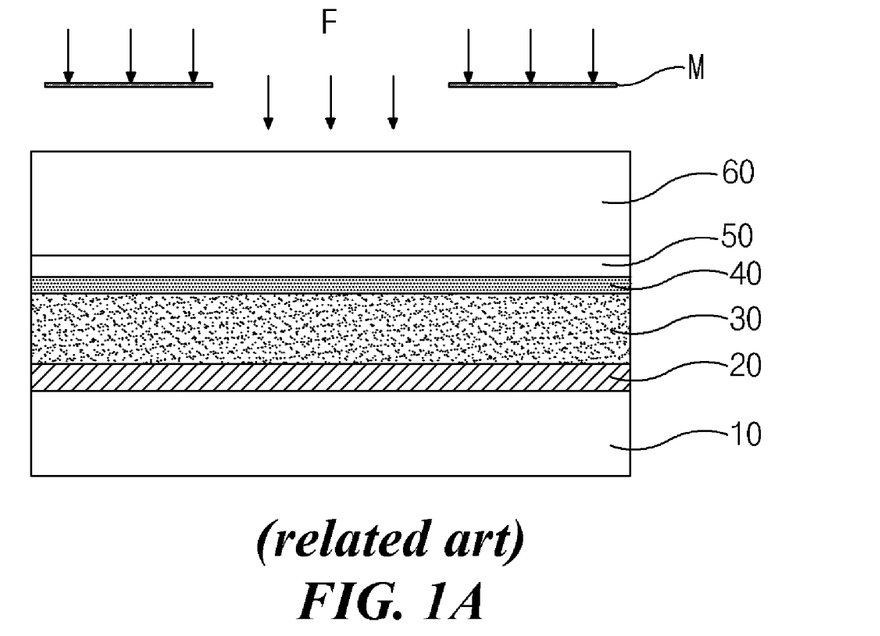
FIGS. 1A to 1D are cross-sectional views showing a method of forming a thin film pattern using amorphous carbon and silicon oxynitride according to the related art.

FIGS. 1A to 1D are cross-sectional views showing a method of forming a thin film pattern using amorphous carbon and silicon oxynitride according to the related art. In FIG. 1A, a thin film 20 is formed on a substrate 10 and an amorphous carbon layer 30 is formed on the thin film 20. In addition, a silicon oxynitride layer 40 and an anti-reflective layer 50 are sequentially formed on the amorphous carbon layer 30. A photoresist (PR) layer 60 is formed on the anti-reflective layer 50. Next, a photo mask M is disposed over the PR layer 60, and the PR layer 60 is exposed to light F through the photo mask M.

Figure 1B:
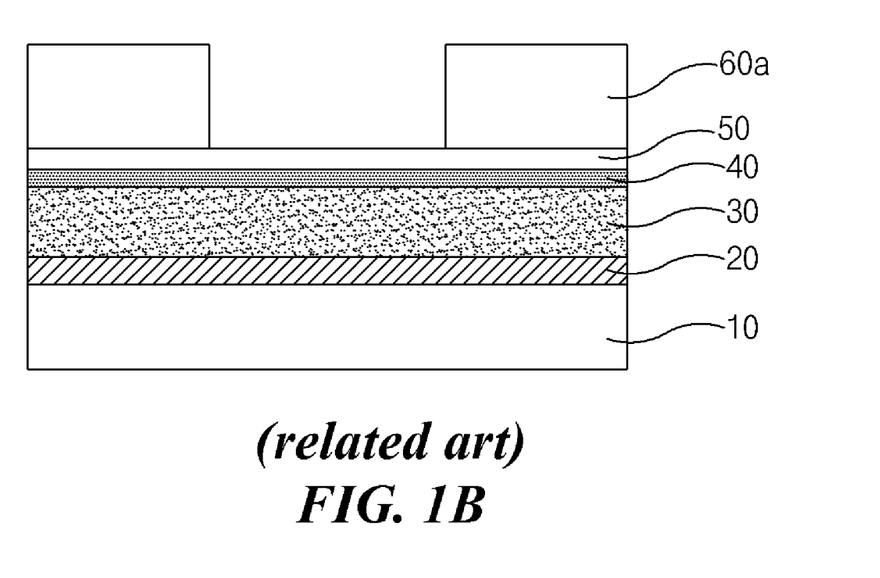

In FIG. 1B, a PR pattern 60a is formed by developing the PR layer 60 (of FIG. 1A). Next, after the anti-reflective layer 50 and the silicon oxynitride layer 40 are sequentially etched using the PR pattern 60a as an etch mask, the PR pattern 60a and the etched anti-reflective layer 50 are removed.

Figure 1C:
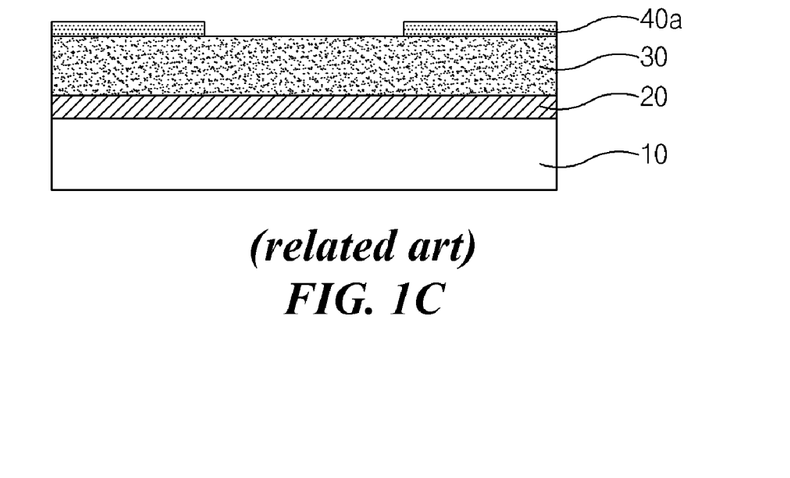
Figure 1D:
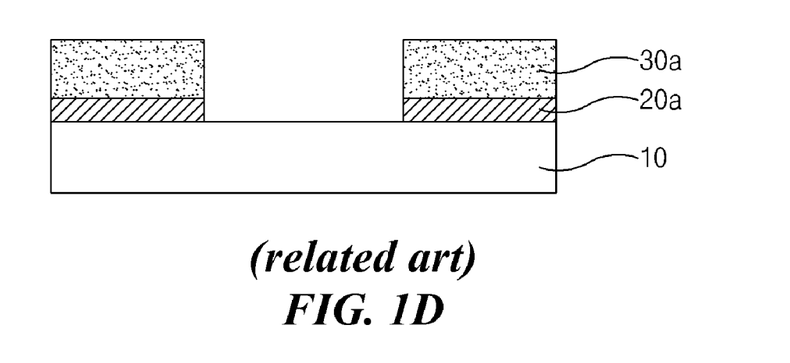

In FIG. 1C, a silicon oxynitride pattern 40a is formed on the amorphous carbon layer 30. In FIG. 1D, after the amorphous carbon layer 30 is etched using the silicon oxynitride pattern 40a as an etch mask to form an amorphous carbon pattern 30a, the silicon oxynitride pattern 40a is removed. Next, the thin film 20 is etched using the amorphous carbon pattern 30a as an etch mask to form a thin film pattern 20a.

The amorphous carbon layer 30 may be formed by a spin-on method or a plasma enhanced chemical vapor deposition (PECVD) method. However, since an etch selection ratio between the thin film 20 and the amorphous carbon pattern 30a is relatively low, the amorphous carbon pattern 30a is required to have a thickness similar to a thickness of the thin film 20. Since an etch rate of the amorphous carbon layer 30 by a spin-on method or a PECVD method is similar to an etch rate of the thin film 20, the thin film pattern 20a may have deterioration such as a striation or a wiggling after the thin film 20 is etched using the amorphous carbon pattern 30a as an etch mask. Alternatively, the amorphous carbon pattern 30a may be eliminated before the thin film pattern 20a is formed.

Figure 2:
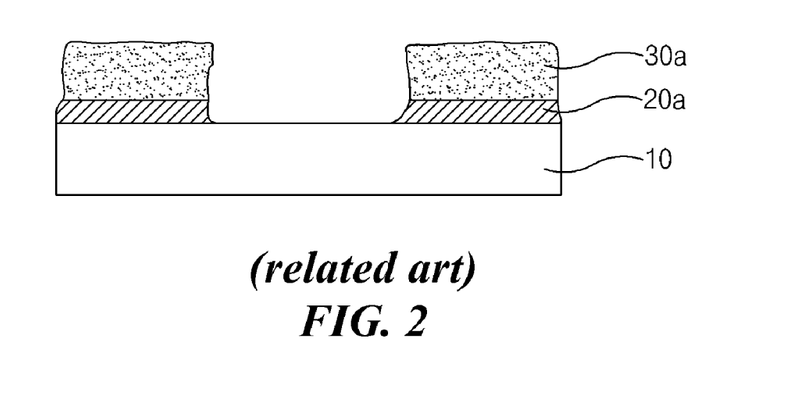
FIG. 2 is a cross-sectional view showing deterioration of a thin film pattern according to the related art.

To solve the above problems, a thickness of the amorphous carbon pattern 30a increases. However, when the thickness of the amorphous carbon pattern 30a increases, a resolution of the amorphous carbon pattern 30a decreases. FIG. 2 is a cross-sectional view showing deterioration of a thin film pattern according to the related art. In FIG. 2, the amorphous carbon pattern 30a may be removed more than the thin film 20 (of FIG. 1C) during the etching step for the thin film pattern 20a. In addition, the thin film pattern 20a may have a poor profile or a poor critical dimension (CD). Furthermore, increase in the thickness of the amorphous carbon pattern 30a may cause deterioration such as an aspect ratio dependent etch rate (ARDE) phenomenon, reduction in etch rate and difficulty in control of the profile.

SUMMARY

Accordingly, the present invention is directed to a method of forming a thin film pattern for a semiconductor device and an apparatus for the same that substantially obviate one or more of the problems due to limitations and disadvantages of the related art.

An object of the present invention is to provide a method of forming a minute thin film pattern for a semiconductor device using an amorphous carbon pattern.

A method of forming a thin film pattern includes: forming a thin film on a substrate; forming an amorphous carbon layer including first and second carbon layers on the thin film, wherein the first carbon layer is formed by one of a spin-on method and a plasma enhanced chemical vapor deposition (PECVD) method and the second carbon layer is formed by a physical vapor deposition (PVD) method; forming a hard mask layer on the amorphous carbon layer; forming a PR pattern on the hard mask layer; forming a hard mask pattern by etching the hard mask layer using the PR pattern as an etch mask; forming an amorphous carbon pattern including first and second carbon patterns by etching the amorphous carbon layer using the hard mask pattern as an etch mask; and forming a thin film pattern by etching the thin film using the amorphous carbon pattern as an etch mask.

In another aspect, an apparatus for forming a thin film pattern includes: a chamber; a substrate supporting unit in the chamber, the substrate supporting unit having a substrate thereon; and first, second and third power supplying units connected to the chamber, the first, second and third power supplying units providing first, second and third powers, respectively.

BRIEF DESCRIPTION OF THE DRAWINGS

The accompanying drawings, which are included to provide a further understanding of the invention and are incorporated in and constitute a part of this specification, illustrate embodiments of the invention.

DETAILED DESCRIPTION OF THE PREFERRED EMBODIMENTS

Reference will now be made in detail to embodiments which are illustrated in the accompanying drawings. Wherever possible, similar reference numbers will be used to refer to the same or similar parts.

FIGS. 3A to 3G are cross-sectional views showing a method of forming a thin film pattern for a semiconductor device according to an embodiment of the present invention.

Figure 3A:
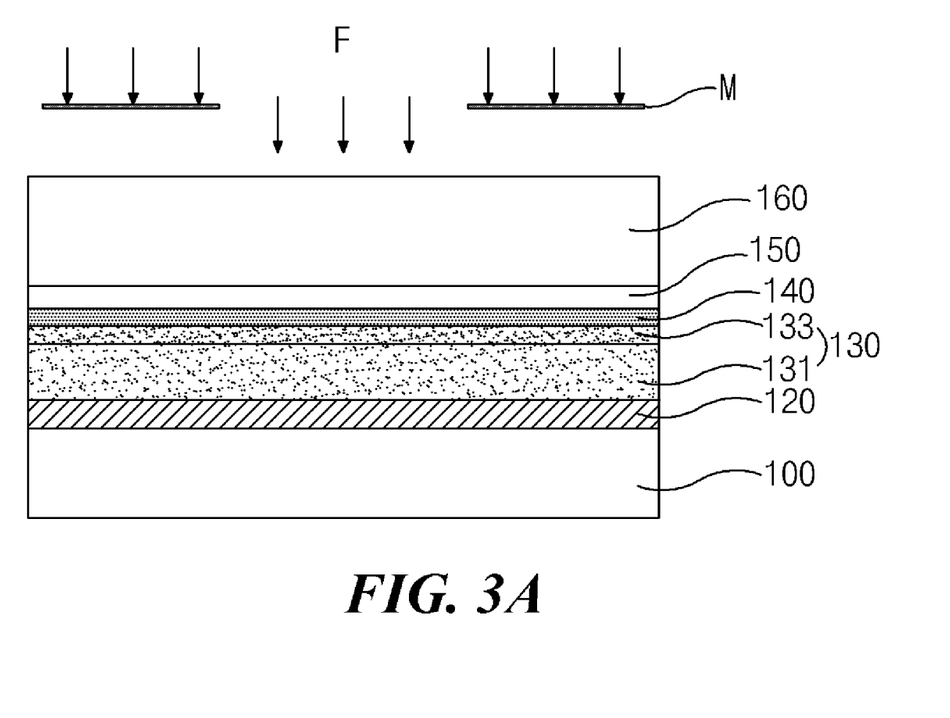
FIGS. 3A to 3G are cross-sectional views showing a method of forming a thin film pattern for a semiconductor device according to an embodiment of the present invention.

In FIG. 3A, a thin film 120 is formed on a substrate 100. For example, the thin film 120 may be formed by depositing one of a metallic material, a semiconductor material and an insulating material. Next, an amorphous carbon layer 130, a hard mask layer 140, an anti-reflective layer 150 and a photoresist (PR) layer 160 are sequentially formed on the thin film 120. The amorphous carbon layer 130 includes a first carbon layer 131 and a second carbon layer 133 on the first carbon layer 131. The first carbon layer 131 is formed by one of a spin-on method (spin coating method) and a plasma enhanced chemical vapor deposition (PECVD) method. For example, the first carbon layer 131 may have a thickness of about 10 nm to about 50 nm for easy elimination after the thin film is etched. The second carbon layer 133 is formed by a physical vapor deposition (PVD) method such as an unbalanced magnetron (UBM) method. For example, the second carbon layer 133 may have a thickness of about 10 nm to about 50 nm. The second carbon layer 133 has a relatively high etch selection ratio with respect to the thin film 120. For example, the etch selection ratio between the second carbon layer 133 and the thin film 120 may be within a range of about 7:1 to about 20:1. Since the second carbon layer 133 is formed by a PVD method that is used under a relatively low temperature, the first carbon layer 131 and the thin film 120 may have a stable state without a thermal stress while the second carbon layer 133 is formed.

Further, the hard mask layer 140 includes one of silicon oxynitride (SiON), silicon oxide (SiOx) and silicon nitride (SiNx). For example, the hard mask layer 140 may have a thickness of about 50 nm to about 200 nm for etching the first and second carbon layers 131 and 133. The anti-reflective layer 150 is used to minimize reflection in a subsequent exposure step for the PR layer 160. For example, the anti-reflective layer 150 may have a thickness of about 10 nm to about 50 nm. The PR layer 160 is formed on the anti-reflective layer 150 by coating a PR material for light having a wavelength smaller than about 193 nm. For example, the PR layer 160 may react to light corresponding to one of argon fluoride (ArF) of a wavelength of 193 nm, fluorine ($F_2$) of a wavelength of 157 nm and extreme ultraviolet (EUV).

After the PR layer 160 is formed on the anti-reflective layer 150, a photo mask M is disposed over the PR layer 160 and a light F corresponding to one of ArF, $F_2$ and EUV is irradiated onto the PR layer 160 through the photo mask M.

Figure 3B:
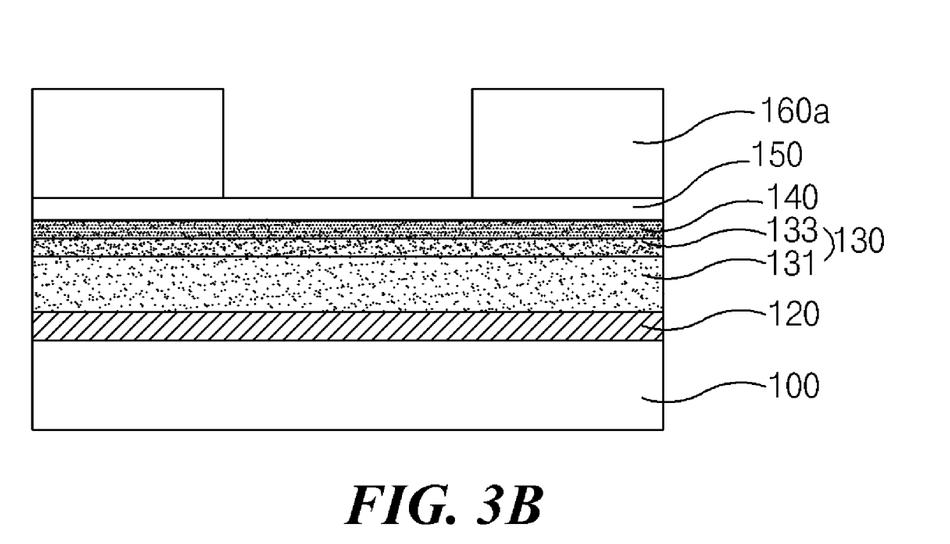

In FIG. 3B, after the PR layer 160 (of FIG. 3A) is exposed to the light F, a PR pattern 160a is formed by developing the exposed PR layer 160.

Figure 3C:
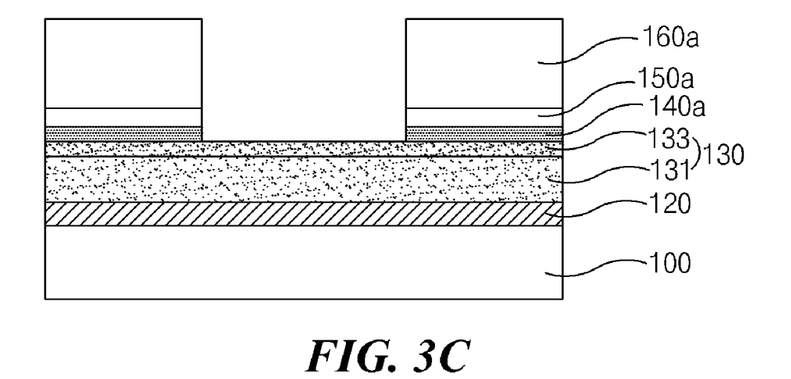

In FIG. 3C, an anti-reflecting pattern 150a and a hard mask pattern 140a are formed by sequentially etching the anti-reflective layer 150 (of FIG. 3B) and the hard mask layer 140 (of FIG. 3B) using the PR pattern 160a as an etch mask. For example, the anti-reflective layer 150 may be etched with a plasma of a mixed gas including carbon tetra fluoride ($CF_4$), oxygen ($O_2$), hexafluoro butadiene ($C_4F_6$) and argon (Ar). Flow rates of carbon tetra fluoride ($CF_4$), oxygen ($O_2$), hexafluoro butadiene ($C_4F_6$) and argon (Ar) may be within ranges of about 10 sccm to about 200 sccm, about 1 sccm to about 30 sccm, about 1 sccm to about 30 sccm, and about 200 sccm to about 800 sccm, respectively. In addition, the hard mask layer 140 of silicon oxynitride (SiON) may be etched with a plasma of a mixed gas including difluoro methane ($CH_2F_2$), octafluoro cyclobutadiene ($C_4F_8$), oxygen ($O_2$) and argon (Ar). Flow rates of difluoro methane ($CH_2F_2$), octafluoro cyclobutadiene ($C_4F_8$), oxygen ($O_2$) and argon (Ar) may be within ranges of about 5 sccm to about 100 sccm, about 5 sccm to about 100 sccm, about 5 sccm to about 100 sccm, and about 200 sccm to about 800 sccm, respectively.

Figure 3D:
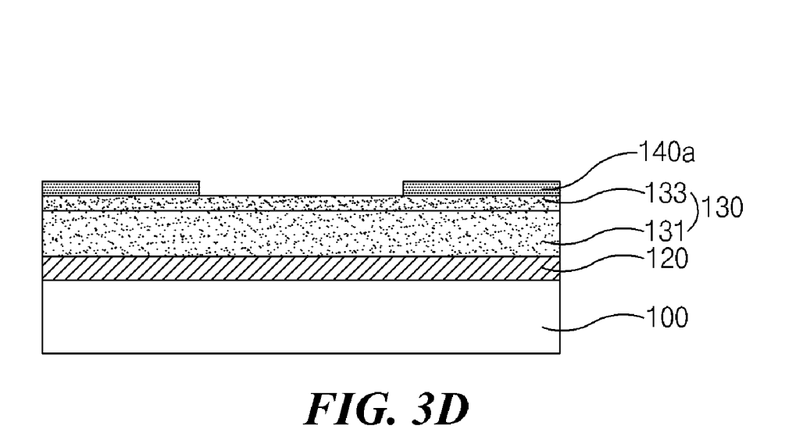

In FIG. 3D, after the anti-reflective layer 150 (of FIG. 3B) and the hard mask layer 140 (of FIG. 3B) are etched, the PR pattern 160a (of FIG. 3C) and the anti-reflecting pattern 150a (of FIG. 3C) are removed. For example, the PR pattern 160a may be removed with acetone. Further, after the PR pattern 160a is removed, a PR residue may be removed by a chemical dry etcher.

Figure 3E:
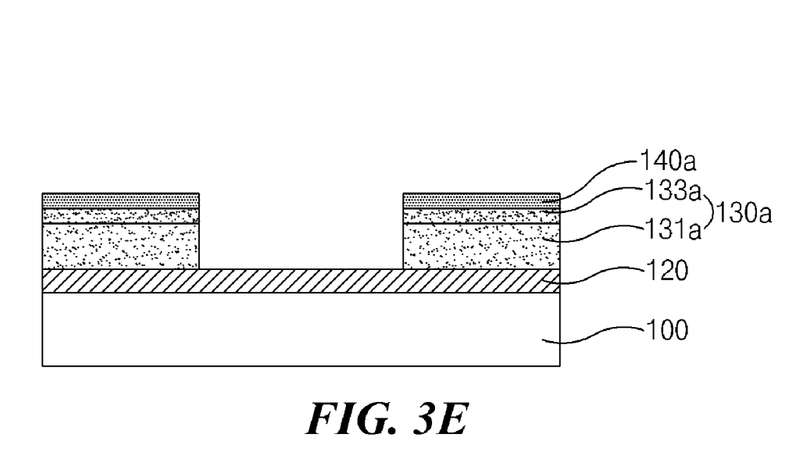

In FIG. 3E, an amorphous carbon pattern 130a including first and second carbon patterns 131a and 133a is formed by etching the amorphous carbon layer 130 including the first and second carbon layers 131 and 133 using the hard mask pattern 140a as an etch mask. For example, the amorphous carbon layer 130 including the first and second carbon layers 131 and 133 may be etched with a plasma of a mixed gas including nitrogen ($N_2$), oxygen ($O_2$) and argon (Ar). Flow rates of nitrogen ($N_2$), oxygen ($O_2$) and argon (Ar) may be within ranges of about 10 sccm to about 200 sccm, about 50 sccm to about 600 sccm and about 50 sccm to about 500 sccm, respectively.

Figure 3F:
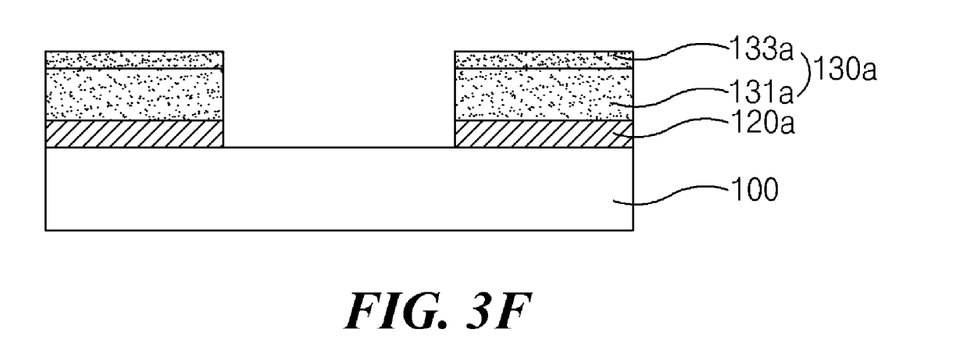

In FIG. 3F, after the amorphous carbon pattern 130a is formed, the hard mask pattern 140a is removed. Next, a thin film pattern 120a having a relatively minute width is formed by etching the thin film 120 using the amorphous carbon pattern 130a including the first and second carbon patterns 131a and 133a. Since the second carbon pattern 133a formed by a PVD method has a relatively high etch selection ratio with respect to the thin film 120, the thin film pattern 120a is formed without deterioration such as a striation and a wiggling.

Figure 3G:
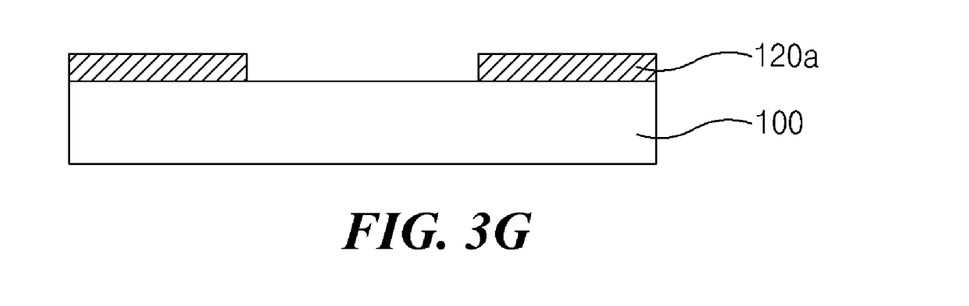

In FIG. 3G, after the thin film pattern 120a is formed, the amorphous carbon pattern 130a including the first and second carbon patterns 131a and 133a is removed. The amorphous carbon pattern 130a may be removed with one of oxygen ($O_2$) and a mixed gas including oxygen ($O_2$). Since the first carbon pattern 131a formed by one of a spin-on method and a PECVD method is easily removed from the thin film pattern 120a, the amorphous carbon pattern 130a is removed without damage to the thin film pattern 120a. The thin film pattern 120a may be used for a semiconductor device such as a flat panel display (FPD) and a solar cell.

Figure 4A:
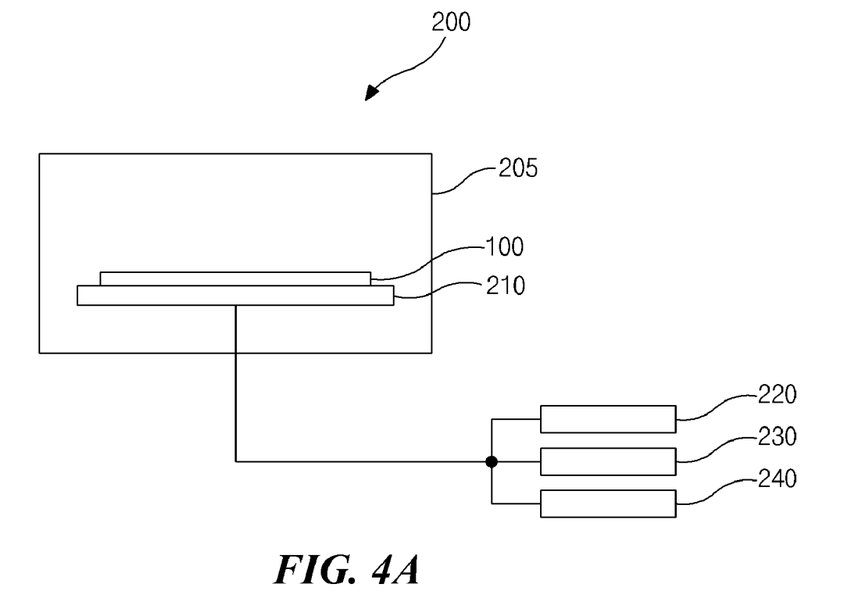
FIG. 4A is a view showing an apparatus for forming a thin film pattern according to an embodiment of the present invention.
Figure 4B:
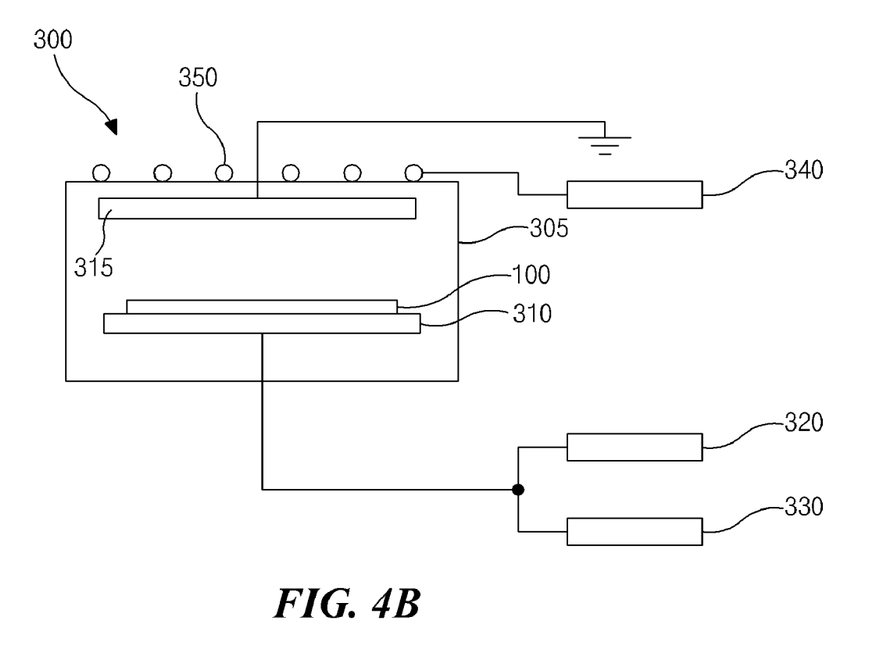
FIG. 4B is a view showing an apparatus for forming a thin film transistor according to another embodiment of the present invention.

FIG. 4A is a view showing an apparatus for forming a thin film pattern according to an embodiment of the present invention and FIG. 4B is a view showing an apparatus for forming a thin film transistor according to another embodiment of the present invention.

In FIG. 4A, an apparatus 200 includes a chamber 205 and first, second and third high frequency power supplying units 220, 230 and 240. The chamber 205 includes a substrate supporting unit 210 and a substrate 100 is loaded on the substrate supporting unit 210. For example, an electrostatic chuck may be used as the substrate supporting unit 210. While the substrate 100 is processed (e.g., a thin film on the substrate 100 is etched), the substrate supporting unit 210 may have a temperature of about −10° C. to about 80° C.

Initially, the chamber 205 may have a pressure of about 1 mTorr to about 500 mTorr. Next, a reaction gas including at least one of carbon tetra fluoride ($CF_4$), hexafluoro butadiene ($C_4F_6$), octafluoro cyclobutadiene ($C_4F_8$), difluoro methane ($CH_2F_2$), oxygen ($O_2$), nitrogen ($N_2$) and argon (Ar) is injected into the chamber 205 of the apparatus 200. The reaction gas is excited to generate a plasma and the substrate 100 is processed.

The first, second and third high frequency power supplying units 220, 230 and 240 are connected to the substrate supporting unit 205. The first, second and third high frequency power supplying units 220, 230 and 240 provide first, second and third powers, respectively. For example, the first high frequency power supplying unit 220 generating a self-bias voltage for controlling an ion energy of the plasma may provide the first power having a frequency of about 400 kHz to about 10 MHz. In addition, the second high frequency power supplying unit 230 may provide the second power having a frequency of about 10 MHz to about 30 MHz and the third high frequency power supplying unit 240 controlling a density of the plasma may provide the third power having a frequency of about 10 MHz to about 100 MHz.

In FIG. 4B, an apparatus 300 includes a chamber 305, first, second and third high frequency power supplying units 320, 330 and 340 and an antenna 350. The chamber 305 includes a substrate supporting unit 310 and a opposite plate facing the substrate supporting unit 315. A substrate 100 is loaded on the substrate supporting unit 310. For example, an electrostatic chuck may be used as the substrate supporting unit 310. The opposite plate 315 may be grounded. In addition, the antenna 350 is formed on an outer top surface of the chamber 305 adjacent to the opposite plate 315. While the substrate 100 is processed (e.g., a thin film on the substrate 100 is etched), the substrate supporting unit 310 may have a temperature of about −10° C. to about 80° C.

Initially, the chamber 305 may have a pressure of about 1 mTorr to about 500 mTorr. Next, a reaction gas including at least one of carbon tetra fluoride ($CF_4$), hexafluoro butadiene ($C_4F_6$), octafluoro cyclobutadiene ($C_4F_8$), difluoro methane ($CH_2F_2$), oxygen ($O_2$), nitrogen ($N_2$) and argon (Ar) is injected into the chamber 305 of the apparatus 300. The reaction gas is excited to generate a plasma and the substrate 100 is processed.

The first and second high frequency power supplying units 320 and 330 are connected to the substrate supporting unit 310, and the third high frequency power supplying unit 340 is connected to the antenna 350. The first, second and third high frequency power supplying units 320, 330 and 340 provide first, second and third powers, respectively. For example, the first high frequency power supplying unit 320 generating a self-bias voltage for controlling an ion energy of the plasma may provide the first power having a frequency of about 400 kHz to about 10 MHz, and the second high frequency power supplying unit 330 may provide the second power having a frequency of about 10 MHz to about 30 MHz. In addition, the third high frequency power supplying unit 340 controlling a density of the plasma may have a frequency of about 10 MHz to about 100 MHz.

In the apparatuses 200 and 300 of FIGS. 4A and 4B, the first power of the first high power supplying unit 220 and 320 may be within a range of about 100 W to about 2000 W, and the second power of the second high power supplying unit 230 and 330 may be within a range of about 300 W to about 600 W. The process conditions such as etch rate and the etch selection ratio may be adjusted using the reaction gas and the apparatuses 200 and 300.

Accordingly, a thin film pattern having a width smaller than about 50 nm is formed with a relatively high etch selection ratio and a relatively easy elimination by using an amorphous carbon pattern including a first carbon pattern formed by one of a spin-on method and a PECVD method and a second carbon pattern formed by a PVD method as an etch mask. In addition, since a thickness of the amorphous carbon pattern is reduced, an aspect ratio is also reduced. As a result, deterioration such as a striation and a wiggling is prevented and an etch profile of the thin film pattern is improved.

Figure 5A:
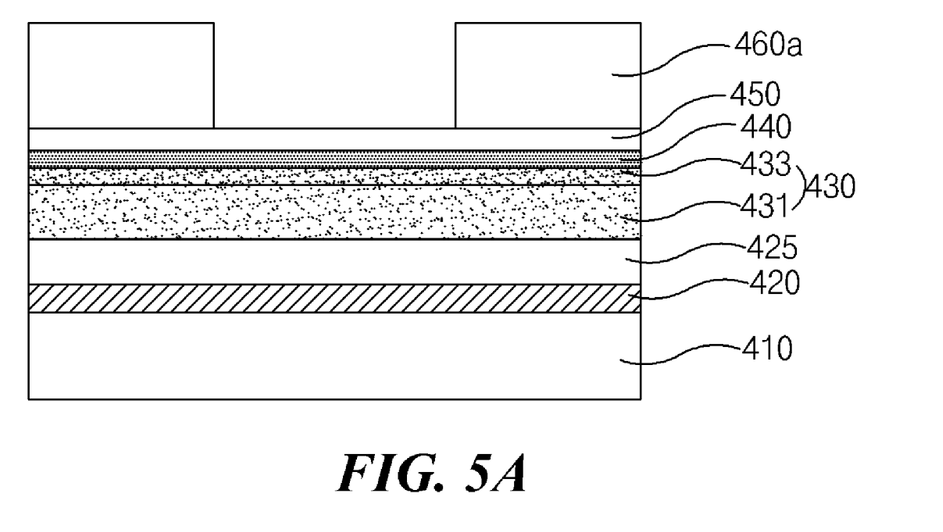
FIGS. 5A to 5C are cross-sectional views showing a method of forming a thin film pattern according to other embodiments of the present invention.
Figure 5B:
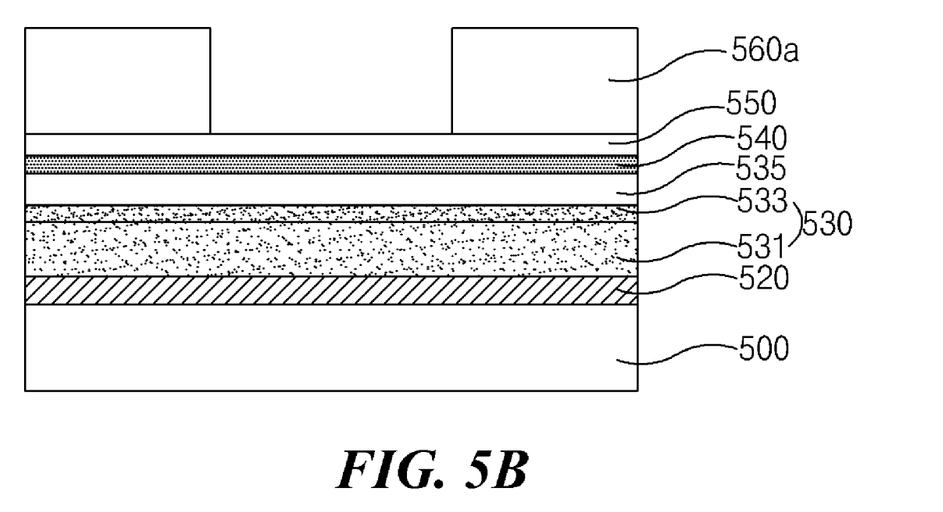
Figure 5C:
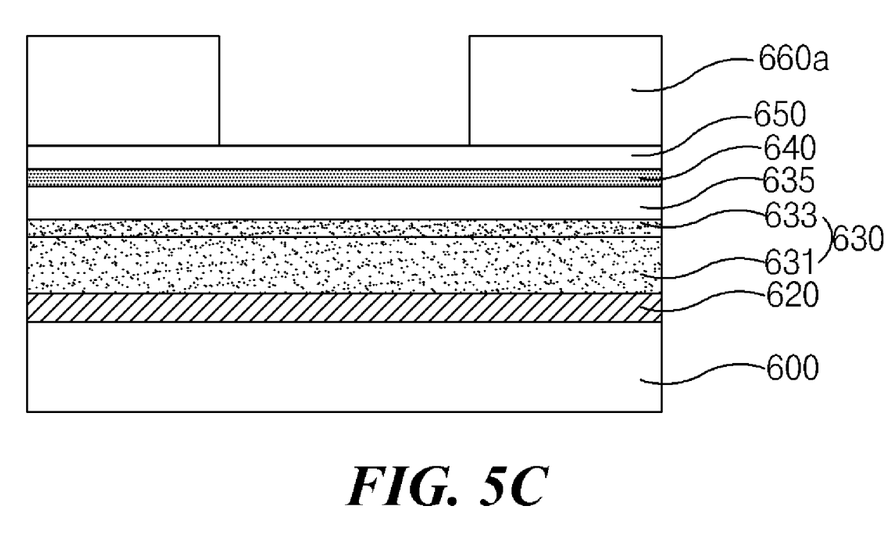

FIGS. 5A to 5C are cross-sectional views showing a method of forming a thin film pattern according to other embodiments of the present invention. Each of FIGS. 5A to 5C shows a cross-sectional view after a PR pattern is formed. The other steps for forming the thin film pattern are similar to those of FIGS. 3A to 3G and omitted.

In FIG. 5A, an auxiliary thin film 425 is formed between a thin film 420 and an amorphous carbon layer 430. An auxiliary thin film pattern (not shown) formed by etching the auxiliary thin film 425 using an amorphous carbon pattern (not shown) is used as an etch mask for the thin film 420, and a thin film pattern (not shown) is formed by etching the thin film 420 using the auxiliary thin film pattern as an etch mask. The auxiliary thin film 425 may include one of an insulating material such as silicon oxynitride (SiOX), silicon oxide (SiOx), silicon carbonitride (SiCN), a semiconductor material such as polycrystalline silicon (p-Si) and a conductive material such as tantalum (Ta), titanium (Ti), chromium (Cr), tantalum nitride (TaN), titanium nitride (TiN) and tantalum silicon nitride (TaSiN). For relatively high etch selection ratio, the thin film 420 may include a conductive material when the auxiliary thin film 425 includes an insulting material, and the thin film 420 may include an insulating material when the auxiliary thin film 425 includes a conductive material. In addition, the auxiliary thin film 425 may have a thickness of about 100 nm to about 800 nm.

In FIG. 5B, a first adhesion promoter layer 535 is formed between a second carbon layer 533 of an amorphous carbon layer 530 and a hard mask layer 540. For example, the first adhesion promoter layer 535 may include one of hydrogenated amorphous carbon, silicon oxide (SiOx) and metallic material formed by a deposition method. In addition, the first adhesion promoter layer 535 may have a thickness of several nanometers. The adhesion between the hard mask layer 540 and the amorphous carbon layer 530 is improved by the first adhesion promoter layer 535.

In FIG. 5C, a second adhesion promoter layer 635 is formed between a second carbon layer 633 of an amorphous carbon layer 630 and a hard mask layer 640. For example, the second adhesion promoter layer 635 may be formed by treating a top surface of the second carbon layer 633 with remote or direct plasma of one of oxygen ($O_2$), nitrogen ($N_2$), argon (Ar) and a mixture gas thereof. The adhesion between the hard mask layer 640 and the amorphous carbon layer 630 is improved by the second adhesion promoter layer 635.

Although not shown, after a first carbon layer is formed, a top surface of the first carbon layer may be treated with a plasma to improve the adhesion between first and second carbon layers of an amorphous carbon layer in another embodiment. For example, the plasma may include a mixed gas of one of nitrogen ($N_2$) and oxygen ($O_2$), oxygen ($O_2$) and argon (Ar), and argon (Ar), and the plasma treatment step may be performed for about 1 sec to about 10 sec. Since the top surface of the first carbon layer may be slightly etched by the plasma to be roughened, the adhesion between the first and second carbon layers is improved.

The thin film pattern formed by the method according to an embodiment of the present invention may include one of a separation pattern for semiconductor elements and a metal line such as a gate electrode, a gate line, a source line and a drain line.

Consequently, in a method of forming a minute thin film pattern according to an embodiment of the present invention, since a thin film is etched using an amorphous carbon layer including a first carbon layer by one of a spin-on method and a PECVD method and a second carbon layer by a PVD method as an etch mask, a thin film pattern having a width smaller than about 50 nm is formed with a relatively high etch selection ratio between the second carbon layer and the thin film layer and a relatively easy elimination of the first carbon layer. As a result, an etch profile of the thin film pattern is improved due to a reduced aspect ratio, and deterioration such as a striation and a wiggling is reduced.

It will be apparent to those skilled in the art that various modifications and variations can be made in a method of forming a thin film pattern of the present invention without departing from the spirit or scope of the invention. Thus, it is intended that the present invention cover the modifications and variations of this invention provided they come within the scope of the appended claims and their equivalents.

What is claimed is:

1. A method of forming a thin film pattern, comprising:
    forming a thin film on a substrate;
    forming an amorphous carbon layer including first and second carbon layers on the thin film, wherein the first carbon layer is formed by one of a spin-on method and a plasma enhanced chemical vapor deposition (PECVD) method and the second carbon layer is formed by a physical vapor deposition (PVD) method;
    forming a hard mask layer on the amorphous carbon layer;
    forming a PR pattern on the hard mask layer;
    forming a hard mask pattern by etching the hard mask layer using the PR pattern as an etch mask;
    forming an amorphous carbon pattern including first and second carbon patterns by etching the amorphous carbon layer using the hard mask pattern as an etch mask; and
    forming a thin film pattern by etching the thin film using the amorphous carbon pattern,
    wherein the hard mask pattern is removed after the amorphous carbon pattern is formed but before the thin film pattern is formed.

2. The method according to claim 1, wherein the thin film is etched using the amorphous carbon pattern as an etch mask.

3. The method according to claim 1, wherein each of the first and second carbon layers has a thickness of about 10 nm to about 50 nm.

4. The method according to claim 1, further comprising forming an anti-reflecting layer between the PR layer and the hard mask layer.

5. The method according to claim 1, wherein an etch selection ratio between the second carbon layer and the thin film is within a range of about 7:1 to about 20:1.

6. The method according to claim 1, wherein the hard mask layer includes one of silicon oxynitride (SiOx), silicon oxide (SiOx) and silicon nitride (SiNx).

7. The method according to claim 1, further comprising:
    forming an auxiliary thin film between the thin film and the amorphous carbon layer; and
    forming an auxiliary thin film pattern by etching the auxiliary thin film using the amorphous carbon pattern as an etch mask,
    wherein the thin film is etched using the auxiliary thin film pattern as an etch mask.

8. The method according to claim 7, wherein the auxiliary thin film includes one of silicon oxynitride (SiON), silicon oxide (SiOx), silicon carbonitride (SiCN), polycrystalline silicon (p-Si), tantalum (Ta), titanium (Ti), chromium (Cr), tantalum nitride (TaN), titanium nitride (TiN) and tantalum silicon nitride (TaSiN).

9. The method according to claim 1, further comprising treating a top surface of the first carbon layer with a plasma of a mixed gas including one of nitrogen/oxygen ($N_2/O_2$), oxygen/argon ($O_2/Ar$), and argon (Ar).

10. The method according to claim 1,
    wherein forming the PR pattern comprises:
        forming a PR layer on the hard mask layer, the PR layer reacting to one of argon fluoride (ArF) of a wavelength of 193 nm, fluorine ($F_2$) of a wavelength of 157 nm and extreme ultraviolet (EUV);
        irradiating a light onto the PR layer through a photo mask; and
        developing the PR layer to form the PR pattern.

11. The method according to claim 1, further comprising forming an adhesion promoter layer between the hard mask layer and the amorphous carbon layer.

12. The method according to claim 11, wherein the adhesion promoter layer is formed on the second carbon layer by a deposition method and includes one of hydrogenated amorphous carbon, silicon oxide (SiOx) and a metallic material.

13. The method according to claim 11, wherein the adhesion promoter layer is formed by treating a top surface of the second carbon layer with a plasma of one of oxygen ($O_2$), nitrogen ($N_2$), argon (Ar) and a mixture gas thereof.

14. The method according to claim 1, wherein the PR pattern is removed after the hard mask pattern is formed but before the amorphous carbon pattern is formed.

* * * * *